(12) United States Patent
Elzinga et al.

(10) Patent No.: US 10,260,684 B2
(45) Date of Patent: Apr. 16, 2019

(54) LOW AND HIGH BEAM LED LAMP

(71) Applicant: Koninklijke Philips N.V., Eindhoven (NL)

(72) Inventors: Marcus Johannes Gerardus Elzinga, Eindhoven (NL); Paul Scott Martin, San Jose, CA (US)

(73) Assignee: Lumileds LLC, San Jose, CA (US)

(*) Notice: Subject to any disclaimer, the term of this patent is extended or adjusted under 35 U.S.C. 154(b) by 293 days.

(21) Appl. No.: 15/104,951

(22) PCT Filed: Dec. 16, 2014

(86) PCT No.: PCT/EP2014/077936
§ 371 (c)(1),
(2) Date: Jun. 15, 2016

(87) PCT Pub. No.: WO2015/091462
PCT Pub. Date: Jun. 25, 2015

(65) Prior Publication Data
US 2016/0319999 A1 Nov. 3, 2016

Related U.S. Application Data

(63) Continuation of application No. PCT/CN2013/089725, filed on Dec. 17, 2013.

(30) Foreign Application Priority Data

Jan. 15, 2014 (EP) .................................. 14151242

(51) Int. Cl.
*B60Q 1/04* (2006.01)
*F21K 9/235* (2016.01)
(Continued)

(52) U.S. Cl.
CPC ................ *F21K 9/235* (2016.08); *F21K 9/23* (2016.08); *F21S 41/147* (2018.01);
(Continued)

(58) Field of Classification Search
CPC .. F21K 9/235; F21K 9/23; F21S 45/40; F21S 45/47; F21S 41/37; F21S 41/147;
(Continued)

(56) References Cited

U.S. PATENT DOCUMENTS 5,528,474 A 6/1996 Roney et al.
5,563,103 A * 10/1996 Komatsu ........... B29C 45/14655
257/E21.504
(Continued)

FOREIGN PATENT DOCUMENTS

CN 1545146 A 11/2004
CN 101317034 A 12/2008
(Continued)

OTHER PUBLICATIONS

First Office Action dated Apr. 4, 2018, China Patent Application No. 20148009442.X, 20 pages.
(Continued)

*Primary Examiner* — Y M. Lee
(74) *Attorney, Agent, or Firm* — Patent Law Group LLP; Brian D. Ogonowsky

(57) ABSTRACT

An LED bulb (10) includes a metal lead frame (50) on which is directly mounted a low beam set of first LED dies (14), a high beam set of second LED dies (16), and a high beam set of third LED dies (16). The lead frame (50) is bent so that the first LED dies (14) face upwards and the second and third LED dies (16) face sideways and in opposite directions. A thermally conductive opaque plastic body is molded around the lead frame and exposes the LED dies. The body includes light-blocking features (26, 32, 40) to cause the (Continued)

light emission pattern of the first LED dies (14) to be limited in lateral and vertical directions for a low beam of a headlight. The light-blocking features also cause the light emission pattern of the second and third LED dies (16) to be less limited in the lateral and vertical directions for a wider high beam of the headlight.

11 Claims, 5 Drawing Sheets

(51) Int. Cl.
| | |
|---|---|
| *F21S 45/40* | (2018.01) |
| *F21V 29/87* | (2015.01) |
| *F21K 9/23* | (2016.01) |
| *H01L 33/32* | (2010.01) |
| *H01L 33/50* | (2010.01) |
| *H01L 33/56* | (2010.01) |
| *H01L 33/58* | (2010.01) |
| *H01L 33/60* | (2010.01) |
| *H01L 33/62* | (2010.01) |
| *F21S 41/19* | (2018.01) |
| *F21S 41/147* | (2018.01) |
| *F21S 41/36* | (2018.01) |
| *F21S 41/37* | (2018.01) |
| *F21S 41/47* | (2018.01) |
| *F21S 45/47* | (2018.01) |
| *F21V 7/00* | (2006.01) |
| *F21V 23/06* | (2006.01) |
| *F21Y 111/00* | (2016.01) |
| *F21Y 101/00* | (2016.01) |
| *H01L 25/075* | (2006.01) |
| *H01L 33/64* | (2010.01) |
| *F21V 23/00* | (2015.01) |
| *F21S 41/32* | (2018.01) |

(52) U.S. Cl.
CPC .............. *F21S 41/192* (2018.01); *F21S 41/36* (2018.01); *F21S 41/37* (2018.01); *F21S 41/47* (2018.01); *F21S 45/40* (2018.01); *F21S 45/47* (2018.01); *F21V 29/87* (2015.01); *H01L 33/32* (2013.01); *H01L 33/502* (2013.01); *H01L 33/56* (2013.01); *H01L 33/58* (2013.01); *H01L 33/60* (2013.01); *H01L 33/62* (2013.01); *F21S 41/321* (2018.01); *F21V 7/00* (2013.01); *F21V 23/003* (2013.01); *F21V 23/06* (2013.01); *F21Y 2101/00* (2013.01); *F21Y 2111/00* (2013.01); *H01L 25/0753* (2013.01); *H01L 33/647* (2013.01); *H01L 2224/48247* (2013.01)

(58) Field of Classification Search
CPC .......... F21S 41/36; F21S 41/192; F21S 41/47; F21S 41/321; H01L 33/32; H01L 33/60; H01L 33/56; H01L 33/58; H01L 33/502; H01L 33/62; H01L 2224/48247; H01L 33/647; H01L 25/0753; F21V 29/87; F21V 23/003; F21V 7/00; F21V 23/06; F21Y 2101/00; F21Y 2111/00

See application file for complete search history.

(56) References Cited

U.S. PATENT DOCUMENTS

| | | |
|---|---|---|
| 7,687,815 B2 | 3/2010 | Kim |
| 7,748,879 B2 | 7/2010 | Koike et al. |
| 8,173,250 B2 | 5/2012 | Greiner et al. |
| 2005/0276063 A1 | 12/2005 | Coushaine et al. |
| 2007/0121326 A1 | 5/2007 | Nall et al. |
| 2007/0278601 A1* | 12/2007 | Goodelle ............ B81C 1/00333 257/416 |
| 2009/0002997 A1 | 1/2009 | Koester |
| 2009/0175044 A1 | 7/2009 | Veenstra et al. |
| 2009/0315068 A1 | 12/2009 | Oshio et al. |
| 2010/0133560 A1 | 6/2010 | Kim et al. |
| 2010/0181885 A1 | 7/2010 | Tessnow et al. |
| 2010/0182788 A1 | 7/2010 | Luo et al. |
| 2010/0213809 A1 | 8/2010 | Roehl et al. |
| 2010/0264451 A1 | 10/2010 | Xue et al. |
| 2012/0097996 A1 | 4/2012 | Lee et al. |
| 2012/0188771 A1 | 7/2012 | Kraus et al. |
| 2013/0088880 A1 | 4/2013 | Duan et al. |
| 2014/0247554 A1* | 9/2014 | Sharma ................ H05K 7/1432 361/695 |

FOREIGN PATENT DOCUMENTS

| | | |
|---|---|---|
| CN | 101539250 A | 9/2009 |
| CN | 201318574 | 9/2009 |
| DE | 202012004965 U1 | 6/2012 |
| DE | 202012004965 U1 | 8/2012 |
| FR | 2988811 A1 | 10/2013 |
| JP | 2004342574 A | 12/2004 |
| JP | 2007019505 A | 1/2007 |
| JP | 2007517928 A | 7/2007 |
| JP | 2007201405 A | 8/2007 |
| JP | 2007214475 A | 8/2007 |
| JP | 2010003743 A | 1/2010 |
| JP | 2012018110 A | 1/2012 |
| KR | 101189016 B1 | 10/2012 |

OTHER PUBLICATIONS

Extended European Search Report dated Oct. 21, 2014, European Application No. 14151242.6, 16 pages.
Article 94(3) EPC dated Mar. 21, 2017, European Application No. 14812522.2, 5 pages.
Article 94(3) EPC dated Oct. 30, 2017, European Application No. 14812522.2, 5 pages.
Extended European Search Report dated Dec. 20, 2017, European Application No. 17185946.5, 13 pages.
EPO as ISA, PCT/EP2014/077936, "International Search Report and Written Opinion", dated May 18, 2015, 22 pages.
CN Second Office Action dated Nov. 12, 2018, China Patent application No. 201480069442.X, 10 pages.
Office Action dated Jul. 17, 2018, Japan Patent Application No. 2016-540586, 12 pages.

* cited by examiner

LOW AND HIGH BEAM LED LAMP

CROSS-REFERENCE TO RELATED APPLICATIONS

The present application is a 371 application of International Application No. PCT/EP2014/077936 filed on Dec. 16, 2014 and entitled "Low and High Beam LED Lamp," which claims the benefit of International Application No. PCT/CN2013/089725 filed on Dec. 17, 2013, and also claims the benefit of EP Patent Application No. 14151242.6 filed on Jan. 15, 2014.

FIELD OF THE INVENTION

This invention relates to a light emitting diode (LED) lamp and, in particular, to an LED lamp that may be used as a headlight in an automobile, where two light levels with different emission patterns are desired.

BACKGROUND

A common type of automobile headlight uses a single, so-called H4, bulb having a 3-point connector that is inserted into a standard 3-point socket. The bulb includes two filaments. One filament is for the low beam, for normal night driving, and another filament is used for the high beam. The high beam uses both filaments. A first of the three connector points is for the ground. Applying a voltage to the second of the three connector points energizes the low beam filament, and applying a voltage to the second and third connector points energizes the high and low beam filaments.

The low beam filament may have a metal shield on one side to limit the beam angle to prevent it being directed into on-coming traffic and to generally cause the light to be directed downward. The high beam filament is unblocked to create a 360 degree emission pattern, resulting in a wider and higher angle beam.

The bulb is inserted into a reflector, which creates a well-defined beam that meets the jurisdictional/legal requirements for headlights.

Designing a suitable LED version of the H4 headlight bulb, which meets the legal requirements, is difficult since LEDs are heat sensitive devices and, unlike filaments, do not emit substantial energy in the IR. Even with state of the art white LEDs, more than half of the input power is converted to heat, and management of this heat in a traditional luminaire designed for a filament bulb, which emits most of its waste heat as infrared radiation, is challenging. Furthermore, LEDs naturally only emit light in a hemispherical pattern, since the bottom of the LED die is mounted on an opaque substrate. Therefore, challenges in designing such an LED headlight bulb include creating the required light emission pattern for both the low beam LEDs and the high beam LEDs, and removing the heat from the LED dies.

For retrofit applications, the LED headlight H4 bulb should directly replace the conventional filament headlight H4 bulbs so that the same headlight reflector can be used.

State of the art designs for LED headlamps, signaling lamps and illumination lamps as e.g. described in US20100213809A1, US20070121326A1, and US20100182788A1 all use a very similar structure in which packaged LEDs are assembled with plastic and metal parts using attachment methods such as solder, glue, screws and clips. This assembly method adds extra manufacturing steps and components that increase quality risks and increase manufacturing cost.

SUMMARY

In one embodiment, a two-level LED bulb is designed to replace a standard filament headlight bulb for an automobile. The LED bulb has a 3-point connector for being plugged into a socket within a headlight reflector. The voltage applied across the connector is the battery voltage, typically about 12 volts for cars and 24 volts for trucks.

The LED dies for the low level beam are mounted to emit in a vertical direction toward the upper portion of the reflector so that the reflector directs the light generally downward. An opaque plastic wall of the bulb body forms a light blocking wall around the low beam LED dies to generally restrict the LED light emission to a vertical and side emission, creating a sharp cut-off line. Limiting the angle of the emission prevents the light from being directed into on-coming traffic.

The integrated plastic walls are designed with a shape that provides a sharp optical cutoff to prevent glare into oncoming traffic.

Because the LEDs and metal frame have a typical operating temperature of less than 250° C., they operate at a much lower temperature than the filament in a bulb (typically above 2300° C.), and a standard moldable plastics can be used for the optical cutoff instead of the metal used for common filament bulbs. The plastics is preferably black in some areas to provide a high contrast cut-off line for use by the optics in the luminaire. The plastics may be coated with an aluminum film or infused with white reflecting substances, such as zinc oxide or titanium oxide, in other areas to provide reflection and styling elements. The plastics is preferably of high thermal conductivity so that heat generated in the region of the LED die can be transferred quickly to the parts of the lamp body most efficient at convection and thermal emission of energy into the surrounding ambient air.

The high beam LED dies comprise one set of LED dies mounted on a vertical wall facing to the right and an identical set of LED dies mounted on the opposite side of the vertical wall facing left. Since both sets of dies emit a radiation pattern, the simplest of which is a Lambertian pattern, the emission essentially fills the reflector with light to create a wide and high angle high beam. The low beam LED dies can also be energized during the high beam mode. Both sets of LED dies have an opaque surface below them so that most of the LED light is reflected off the top of the reflector, which redirects the light toward the road. Therefore, the opaque surface limits the upper angle of the reflector light emission.

A major challenge in elimination of the assembly steps associated with LED lamp manufacturing is the recognition that thermo-plastics can be combined with LEDs. This is not at all obvious since LED packaging is currently designed for solder reflow onto printed circuit boards or similar structures typically below 260° C. for 10's of seconds in a gaseous environment. Thermo-plastics melt and are injected into a mold at high temperatures typically above 260° C. under very high pressure.

A second major challenge of using thermally conductive plastics is that the best of these are also electrically conductive, so an electrical isolation scheme must be developed to isolate the electrically conductive plastic from the normal current flow through the LED bulb.

Due to the use of high brightness LED dies, high heat is generated by each LED die in a very small area, typically about 1 mm$^2$. To remove this high heat, a novel integrated process is used in which the LED dies are directly bonded to an electrically conductive lead frame made, for example, of steel or copper or metal coated ceramic, which has been selectively coated with a dielectric film in the event the plastic is electrically conducting (the plastic may contain metal to better conduct heat). A phosphor and primary optic (e.g., hemispherical lenses) are molded over the LED dies to produce a white light with good light extraction efficiency. Circuit elements, such as a resistor, capacitor, diode, or diode arrays (such as bridge rectifiers) are attached to the lead frame, and then thermally conductive plastic is molded over the lead frame, including the circuit elements, all together making a fully functional LED bulb. The lead frame acts as a heat distributor to distribute the heat into the thermally conducting plastic over a wide area of the bulb body. The lead frame supporting the LED dies may be much wider than the LED dies to better spread the heat into the plastic. The plastic, through the use of fins or other such structures, transfers the heat from the plastic to the ambient air through both convection and thermal radiation.

Covering regions of the lead frames with an insulating layer allows the use of thermally conducting plastics containing metal, metal particles, carbon fiber, graphene, graphite or other thermally and electrically conducting materials for increasing the thermal conductivity without shorting out the electrical circuit. Very typically, thermally conducting plastics that are electrically conductive are both more thermally conductive than thermally conducting plastics that are not electrically conductive and also lower cost for the same level of thermal conductivity.

A single lead frame or a combination of multiple lead frames may be used to support the low beam and high beam LED dies. If a single lead frame is used, the lead frame is bent to allow the low beam LED dies and the high beam LED dies to be perpendicular to each other. In another embodiment, two or three separate lead frames may be used for the three positions of the LED dies, and the lead frames are fixed in place by the plastic body molded over the lead frames.

In one embodiment, vertical LED dies are used that have a bottom metal electrode directly bonded to the lead frame. Other types of LED dies may be used. Ends of the lead frame terminate at the three connector points for selectively energizing the LED sets.

The design may be adapted for tail lights that have a high stop-brightness level and a lower brightness level. The design may also be adopted for single filament applications, such as MR16 bulbs, which are commonly used in low voltage AC household lighting. The design can also be adapted for typical AC line voltages of 110AC or 220AC by properly selecting a dielectric coating of the conducting lead frame, with dielectric and thickness properties sufficient to prevent shorting in higher voltage applications. Other discrete circuit elements can be added to the frame as needed depending on the desired circuit configuration. The molded plastic encapsulates these components, providing both a robust mechanical and environmental shield but also a very efficient thermal spreading path to ambient air.

In many of the designs, white light is desired. White light can be made with blue or UV LEDs in combination with phosphors known by those skilled in the art. In one embodiment, a phosphor layer is deposited directly over the blue LED die prior to primary lens overmolding. In a second embodiment, a clear sub-primary lens is molded directly over the blue die, a phosphor film made from a plurality of phosphors and silicone is laid over the sub-primary lens, and then a primary lens is molded directly over the combination of the die, sub-primary lens, and phosphor film.

BRIEF DESCRIPTION OF THE DRAWINGS

Elements that are the same or similar are labeled with the same numeral.

DETAILED DESCRIPTION

Figure 1:
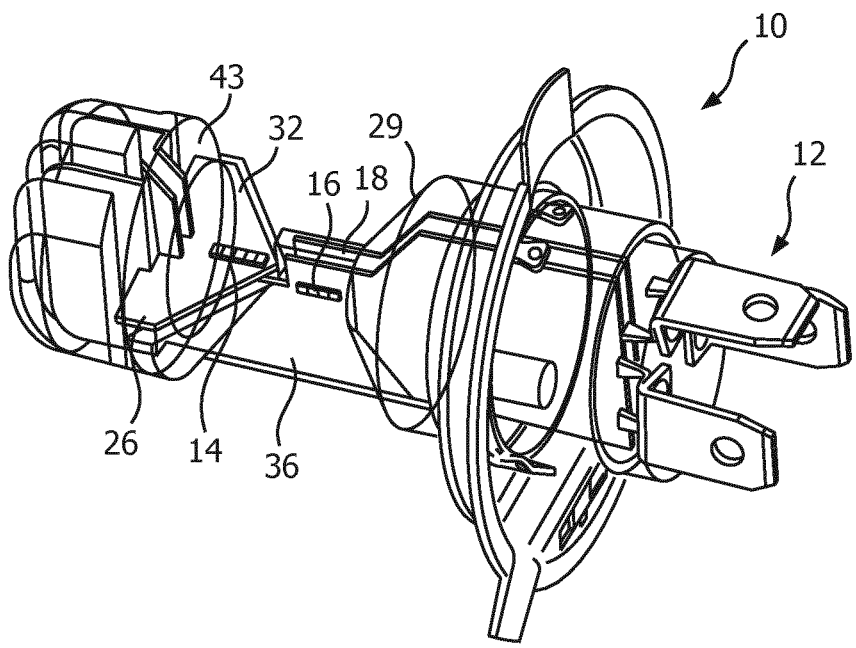
FIG. 1 is a partially transparent perspective view of the LED bulb in accordance with one embodiment of the invention.
Figure 2:
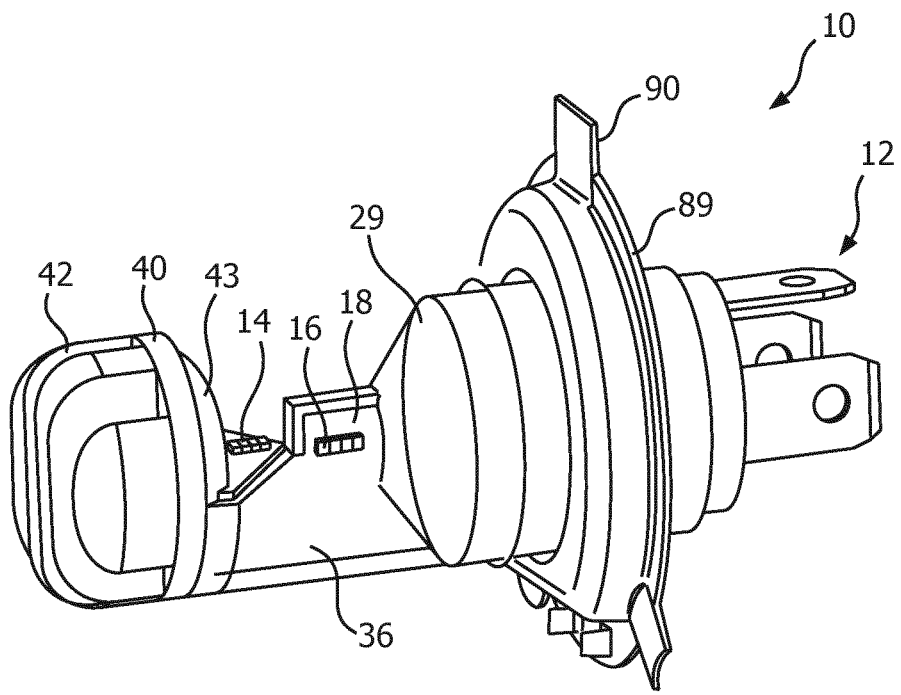
FIG. 2 is a non-transparent perspective view of the LED bulb of FIG. 1.

FIGS. 1 and 2 are perspective views of an LED bulb 10 having a H4 base with three connector points 12 for being received by a conventional headlight socket in an automobile. Conventional circuitry, such as resistors, capacitors, and diodes may be included in the base for converting the battery voltage to the desired current for the LED dies. The bulb has a set of low beam LED dies 14 and a set of high beam LED dies 16. An identical set of high beam LED dies 16 is mounted on the other side of the plastic wall 18.

Four low-beam LED dies 14 and eight high beam LED dies 16 are used in the example, but any number of LED dies can be used to achieve the required brightness.

Figures 7, 8, 9, 10:
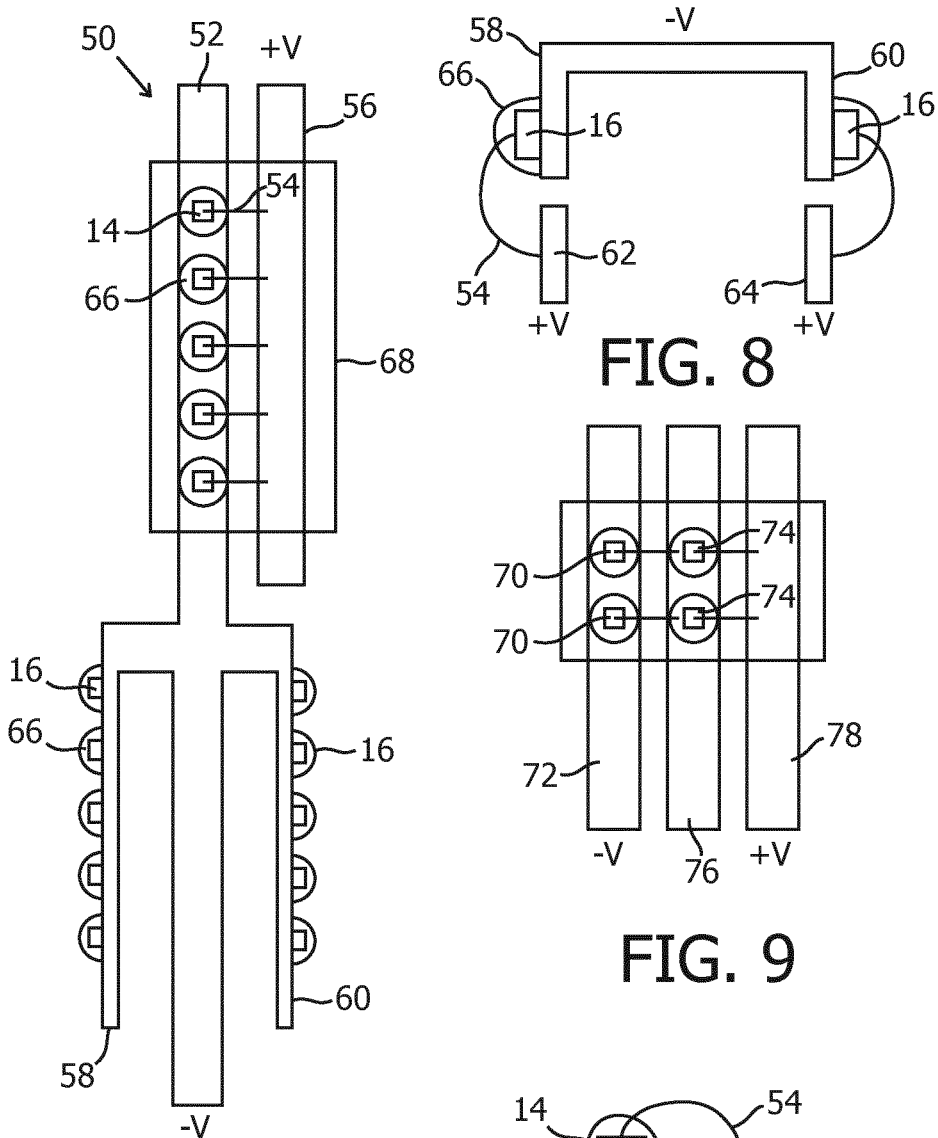
FIG. 7 is a top down view of a portion of the lead frame molded into the bulb's plastic housing, where the low beam and high beam LED dies are mounted directly on the lead frame, and the lead frame is bent to cause the low beam and high beam LED dies to be perpendicular.
FIG. 8 is an end view of the lead frame of FIG. 7 illustrating the arrangement of the high beam LED dies.
FIG. 9 illustrates how LED dies may be connected in series and parallel to achieve a desired voltage drop.
FIG. 10 is an end view of three separate lead frames positioned with respect to one another for supporting the three sets of LED dies, where the lead frame positions are fixed by the molded plastic body.

The bottom metal electrodes of the LED dies 14 and 16 are directly mounted on a single lead frame, described with respect to FIGS. 7-9. Alternatively, the LED dies 14 and 16 may be mounted on three separated lead frames. In the diagrams, vertical-structure LEDs are shown with a single LED junction per LED die. However, the approach is very versatile and can be adapted to multi-junction LED dies, lateral, and flip chip LED dies. Wires are then bonded between the top electrodes of the dies 14/16 and other sections of the lead frame.

For applications where phosphor-converted LEDs are used, a phosphor layer can be deposited over the LED die.

An optical lens is molded over the LED either individually or in combination.

The areas of the conductive frame that will be exposed directly to high electrical conductivity thermal plastic are coated with a dielectric layer. The dielectric layer can, in some embodiments, also cover the optical lens. The dielectric layer can also be masked or later removed in some areas so as to leave selective areas of the frame unprotected for purposeful electrical connection. Preferred dielectric materials for coating the conducting frame are Teflon, glass, silicone, silicon dioxide, aluminum oxide, and other metal oxides because they can sustain both high dielectric standoff voltages and high temperatures.

A high thermal conductivity plastic is molded around the lead frame on top of the dielectric layer and in contact with the edges of the optical lens of the LED dies 14/16 to completely seal the lead frame for protection. The plastic contains metal for a high thermal conductivity of 110 W/mK. In other embodiments, thermally conductive materials such as graphite powder, graphene sheets, diamond powder, and aluminum nitride powder are used to load into the plastic prior to injection molding. Accordingly, for that plastic, the lead frame is coated with a dielectric layer, such as Teflon, silicone, a thermal oxide, or nitride, in places where the plastic will contact the lead frame. Plastics with a thermal conductivity of greater than 50 W/mK are preferred, and a resistivity of less than 1000 Ohms-cm is preferred. A black plastic is preferred to maximize the opaqueness of the light-blocking features. The heat conducted by the lead frame is removed by the plastic, and the plastic is cooled by ambient air. In one embodiment, the dielectric layer has an electrical resistivity of >$10^4$ Ohm-m, and the electrically conductive plastic/polymer body has an electrical resistivity <$10^4$ Ohm-m and a thermal conductivity >1 W/mK.

There is a left side bulb design and a right side bulb design. The left side bulb limits the left side light emission out of the headlight reflector for the low beam to avoid the light being directed into the eyes of on-coming drivers on the left side. Similarly, the right side bulb limits the right side light emission out of the headlight reflector for the low beam to avoid the light being directed into the eyes of on-coming drivers on the right side. FIG. 1 illustrates a left side bulb.

FIGS. 3-6 are simplified schematic views of the bulb 10 installed in a left side headlight reflector showing the light rays emitted by the low beam and high beam LED dies. Only portions of the molded plastic body that are relevant for the description are shown for simplicity. The dimensions of FIGS. 3-6 do not exactly match the more accurate FIGS. 1 and 2 in order to better illustrate relevant portions of the embodiment.

Figure 3:
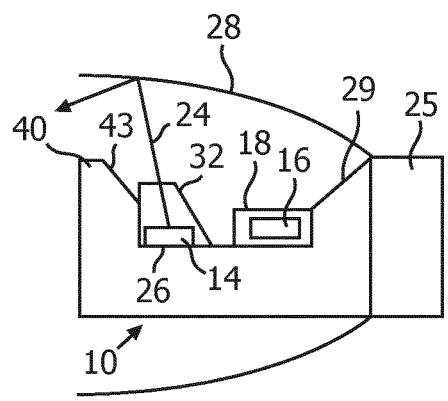
FIG. 3 is a schematic left side view of the LED bulb installed in a left headlight reflector of an automobile illustrating a low beam light ray. Only portions of the molded plastic body that are relevant for the description are shown for simplicity in FIGS. 3-6.

FIG. 3 is a schematic side view of the LED bulb 10 installed in a left side headlight reflector of an automobile illustrating a low beam light ray 24. The socket 25 is shown. All four of the low beam LED dies 14 are represented by a single block for simplicity. The black plastic surface 26 (also see FIG. 4) blocks the downward light from the low beam LED dies 14 so the low beam light is generally directed upward, as shown by light ray 24. This light is reflected downward by the generally parabolic reflector 28 so that the low beam is not directed into the eyes of drivers in front of the automobile. Light directed toward the back of the bulb 10 may be redirected forward and outward by a reflective aluminum layer 29 (FIGS. 1 and 2) over a conical portion of the bulb 10. The reflective portions may instead be a white coating containing zinc oxide or titanium oxide.

Figure 4:
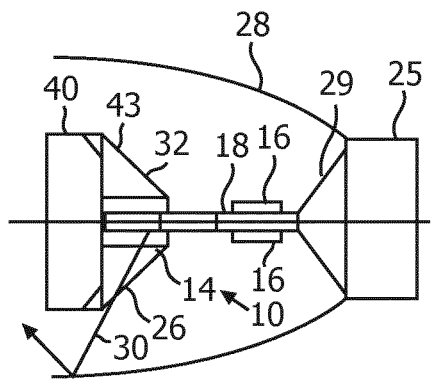
FIG. 4 is a schematic top down view of the LED bulb installed in the left headlight reflector illustrating a low beam light ray.

FIG. 4 is a schematic top down view of the LED bulb 10 installed in the left side headlight reflector illustrating a low beam light ray 30. The black vertical plastic wall 32 (also see FIG. 3) blocks the right side light emission of the low beam LED dies 14 so there is only a left side emission. This light is reflected downward to the road in front of the automobile, and the reflector 28 causes the light to have a well-defined cut-off on the left side so that only a relatively small amount of the light is directed into the oncoming traffic on the left side.

A right side bulb (not shown) has an opposite arrangement of the wall 32 and surface 26. In one embodiment, for the right side bulb, there is no vertical wall since there is not likely to be any on-coming traffic on the right side.

Figure 5:
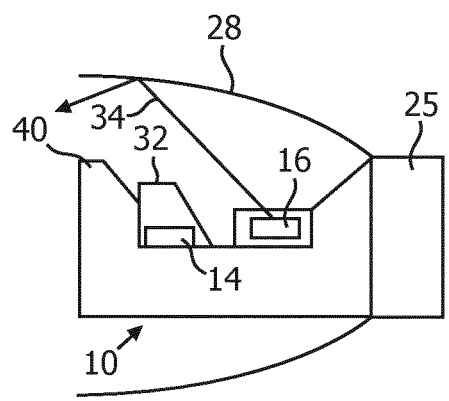
FIG. 5 is a schematic left side view of the LED bulb installed in the left headlight reflector illustrating a high beam light ray.

FIG. 5 is a schematic left side view of the LED bulb 10 installed in the headlight reflector 28 illustrating a high beam light ray 34. As seen by FIGS. 1 and 2, the high beam LED dies 16 are arranged to have only some amount of blockage from the opaque sloped surface 36 under the LED dies 16. Therefore, since the light from the high beam LED dies 16 is widely directed upward and sideways, the light exiting the reflector 28 will be a wide beam in the lateral and vertical directions.

The front emissions of the LED dies 14 and 16 directed toward the front of the automobile are blocked or redirected by the front portion 40 of the bulb (FIG. 2), which has grooves 42 for air flow to help cool the plastic. An angled reflective portion 43 serves to reflect some light upwards. Therefore, virtually all light exiting the reflector 28 is shaped by the reflector and the plastic walls to meet the jurisdictional standards.

Figure 6:
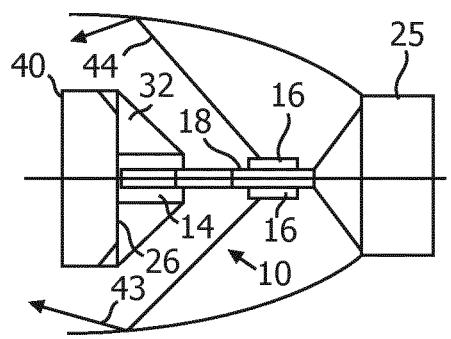
FIG. 6 is a schematic top down view of the LED bulb installed in the left headlight reflector illustrating two high beam light rays.

FIG. 6 is a schematic top down view of the LED bulb 10 installed in the left headlight reflector 28 illustrating two high beam light rays 44 and 46. The reflector 28 may be shaped to direct the high beam light in any pattern, including an asymmetrical pattern.

During high beam operation, power can be supplied to all three prongs 12 to energize both the low beam LED dies 14 and the high beam LED dies 16, so the high beam will be a combination of the light from the low beam LED dies 14 and the high beam LED dies 16.

FIGS. 7 and 8 illustrate one possible arrangement of the LED dies 14 and 16 on a copper lead frame 50. Typically, there are many connected lead frames in an array stamped from a sheet of copper, and the lead frames are processed simultaneously to simplify handling. The lead frames are then separated for each LED bulb so that there is a ground lead and two positive power leads for the low and high beams.

The ends of the lead frame 50 are electrically connected to the robust connector 12 (FIG. 1) prior to the plastic molding step, such as by soldering. In another embodiment, the lead frame 50 itself also forms the connector 12 so is relatively thick. Conventional power regulation circuitry, such as resistors, capacitors, and diodes, may be connected between the lead frame 50 and connector 12 to condition the battery voltage for energizing the LED dies. Such circuitry is encased in the molded plastic body.

Initially, the lead frame 50 is flat, and the bottom metal electrodes of the LED dies 14 and 16 are directly bonded to the lead frame 50, such as by soldering, ultrasonic welding, or a conductive epoxy. The LED dies 14 and 16 in the example are vertical LED dies, with a bottom electrode and a wire-bonded top electrode, but other types of LED dies can be used. The metal bonding provides an excellent thermal path to the copper lead frame 50, which then spreads the heat.

After the LED dies 14 and 16 are bonded to the lead frame strips, the top electrodes are wire bonded to other strips of the lead frame 50. In the example of FIG. 7, the LED dies 14 are mounted on the lead frame strip 52, and the top electrodes of the LED dies 14 are connected via a wire 54 to the strip 56. Thus, the LED dies 14 are connected in parallel. The strip 52 is connected to one of the prongs 12 (FIG. 1), and the strip 56 is connected to another of the prongs 12.

Similarly, as shown in FIGS. 7 and 8, the LED dies 16 are mounted on the strips 58 and 60 (shown after being bent in FIG. 7), and the top electrodes are connected by wires 54 to the strips 62 and 64 in FIG. 8. FIG. 8 is an end view of FIG. 7 showing how the lead frame 50 is ultimately bent prior to being molded into the plastic body.

After wire bonding, the LED dies 14 are coated with a phosphor, such as by screen printing.

If the plastic material for the body is electrically conductive, the portions of the lead frame 50 (and other circuitry) that will be in contact with the plastic are coated with a dielectric, such as by using a thermal oxide process, a nitride deposition process, a spraying process (e.g., for Teflon, etc.), a dipping process, or other process. This may be done by masking the area around the LED dies 14/16 with a photoresist where the lead frame is to be exposed through the plastic, followed by coating the lead frame with a dielectric layer, then removing the mask. In another embodiment, the entire lead frame is coated with a dielectric, and the dielectric is then etched away using a masked etch step. If the dielectric is transparent and thin, the dielectric may even be deposited over the LED die lenses 66 and all the other circuitry. Screen printing the dielectric may instead be performed, obviating the need for a mask.

In another embodiment, the patterned dielectric coating is deposited prior to the LED dies 14 being bonded to the exposed portions of the lead frame.

Over 20% of the lead frame, and up to 90% of the lead frame, will typically be coated with the dielectric.

Clear hemispherical lenses 66 are molded over all the LED dies for improving light extraction and for protecting the LED dies. This may be done before or after the dielectric coating, if any, is deposited. A clear or opaque plastic 68 may optionally be molded around the strips of the lead frame 50, but not over the lenses, to protect the wires 54 and secure the strips together before the lead frame 50 is cut (singulated) and before the main plastic body is molded over the lead frame 50.

The block 68 may instead represent a portion of a mask for covering the LED die areas, and other required areas, when optionally coating the lead frame with a dielectric, if the plastic body is electrically conductive.

The lead frame 50 is then bent, as shown in FIGS. 7 and 8. The prongs 12 (FIG. 1) are connected to the strips, and the lead frame 50 is molded into the plastic body, as shown in FIGS. 1 and 2.

The plastic body may be molded such that the plastic contacts and seals around the edges of the lenses 66, providing extra protection of the LED dies 14. The plastic may be molded to a high positional tolerance. If the plastic is electrically conductive, the dielectric coating of the lead frame needs to extend under the lenses 66.

In the example of FIGS. 7 and 8, if the positive terminal of the battery is connected to the strip 56, via one prong 12, and the strip 52 is connected to ground, via another prong 12, the low beam LED dies 14 will turn on. If the positive terminal of the battery is also connected to the strips 62 and 64, via the remaining prong 12, both sets of LED dies 14 and 16 will turn on for the high beam. Power regulation circuitry may be interposed between the prongs 12 and the strips.

In another embodiment, the high beam LED dies 16 need not be 90 degrees with respect to the low beam LED dies 14 but may be greater than 60 degrees, depending on the desired beam.

In one embodiment, the LED dies 14 and 16 are GaN based and emit blue light. The LED dies are coated with a YAG phosphor, or other suitable phosphor, so that a combination of the blue light leaking through the phosphor and the phosphor light create a white light that meets the jurisdictional requirements for headlights. In one embodiment, the high beam output is over 1000 Lumens. The LED dies 14 and 16 may instead emit UV light. In one embodiment, the phosphor layer is deposited directly over the blue LED die prior to primary lens overmolding. In a second embodiment, a clear sub-primary lens is molded directly over the blue LED die, a phosphor film made from a plurality of phosphors and silicone is laid over the sub-primary lens, and then a primary lens is molded directly over the combination of die, sub-primary lens, and phosphor film.

In the example, all the LED dies 14 and 16 are connected in parallel when on. However, in more complex embodiments, any number of the LED dies may be connected in series to achieve a desired voltage drop. The LED dies may be multi-junction dies to achieve a desired voltage drop. A typical voltage drop of a single LED die may be between 3-4 volts, so a current limiter is required in the base of the bulb 10 to control the current through the LED dies. This may be done with a passive resistive network molded into the plastic body. Such a current limiter may be obviated by connecting LED dies in series to have a voltage drop close to 12 volts. FIG. 9 illustrates how LED dies may be connected in series. As shown in FIG. 9, the LED dies 70 mounted on the strip 72 are connected in parallel. The LED dies 74 mounted on the strip 76 are also connected in parallel. The wire bonding between the various LED dies and the strips 76 and 78 cause the two sets of LED dies to be connected in series. A voltage applied across the strips 72 and 78 turns the LED dies on. This technique can be used to create any desired voltage drop.

In another embodiment, three separate lead frames are used to support the LED dies in the three orientations. FIG. 10 is an end view of three separate lead frames, having strips 81-86, positioned with respect to one another for supporting the LED dies 14 and 16 in the three orientations, where the lead frame positions are fixed in place by the molded plastic body (FIGS. 1 and 2) and the body has openings for the lenses 66. No bending of a lead frame is required in this embodiment. The strips are electrically connected by wires or other types of connectors to the prongs 12 (FIG. 1), or the prongs 12 are part of the lead frame. A top view would be similar to FIG. 7 except the strips would not be connected.

A similar type of bulb may be created for a tail light, where one set of LED dies is used for a low level tail light and another set of LED dies contributes light for a higher brightness stop light or turn signal.

Here we teach that it is possible to create a LED bulb in which LED dies are placed on a conducting substrate, clear lenses are molded over the LEDs, and the entire part is insert-molded in a thermo-plastic at a much higher temperature but for a much shorter time.

Figure 11:
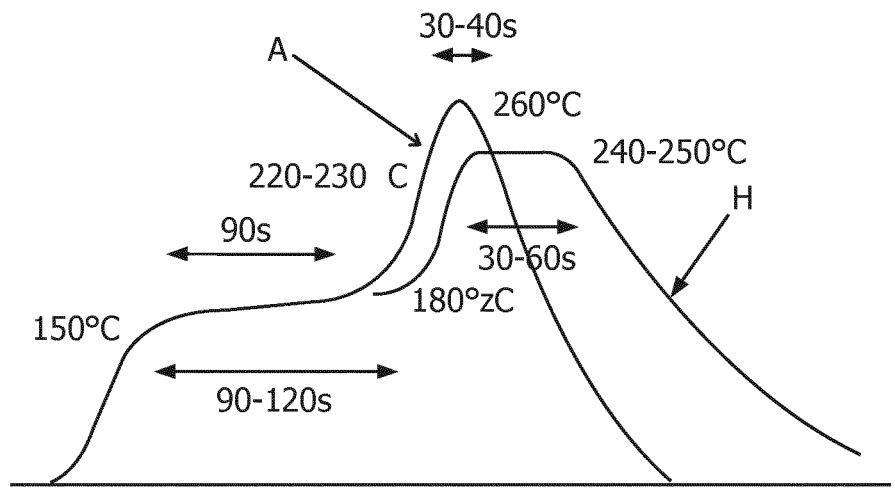
FIG. 11 shows a typical temperature profile, using Tin-Silver-Copper (SAC) solder, during manufacture of the bulb.

The manufacture of the LED bulb described herein is enabled by the use of injection molding (instead of assembly) as the technique for combining LED dies, LED lens, conducting substrate, and thermally conducting LED bulb body. In FIG. 11, we show a typical solder reflow profile for use of SAC solder in attachment of the LEDs onto metal substrates (e.g., lead frames). Curve "A" indicates an "angle type" solder reflow process, and curve "H" indicates a "hat type" solder reflow process. As is shown in FIG. 1, for both of the angle type and the hat type, the temperature is ramped slowly over a period of 90-150 seconds, first to an intermediate temperature between 150-180° C. and then only slightly more rapidly over a period of 30-60 seconds to a temperature typically between 240-260° C. The temperature must be ramped slowly to ensure that the solder fully melts, wetting the metal contacts on both the LED and the substrate and creating a reliable solder joint. Great effort is put into keeping the maximum temperature as low as possible and melting and cooling the solder joint to prevent rapid temperature change and cracking. The LEDs and conducting substrate are then assembled with plastic and metal parts to create a finished lamp. The temperature profile is done in a gaseous environment and the maximum temperature, typically below 260° C., is kept as low as possible to prevent damage to the LEDs. The time above 240° C. is typically 30-60 seconds.

Figure 12:
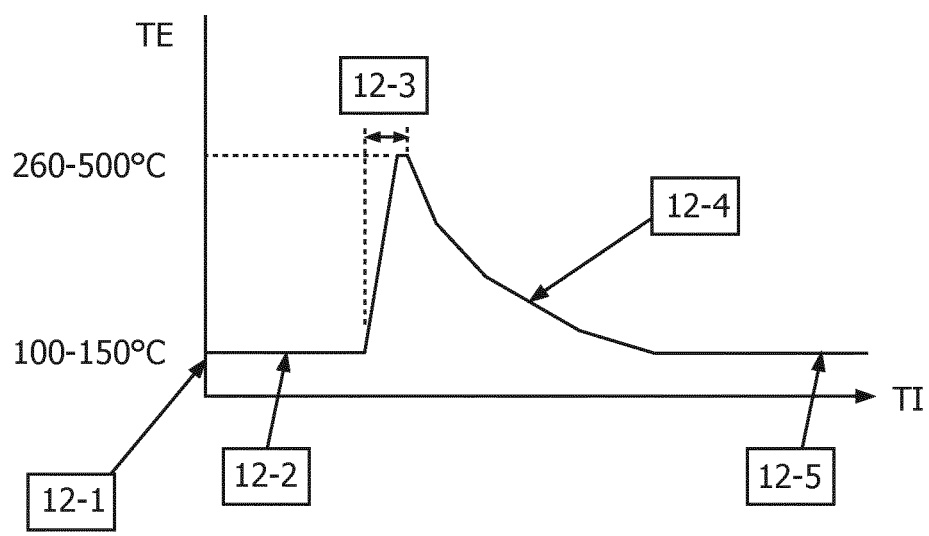
FIG. 12 shows a typical temperature profile for thermoplastic injection molding during manufacturing of the bulb.
Figure 13:
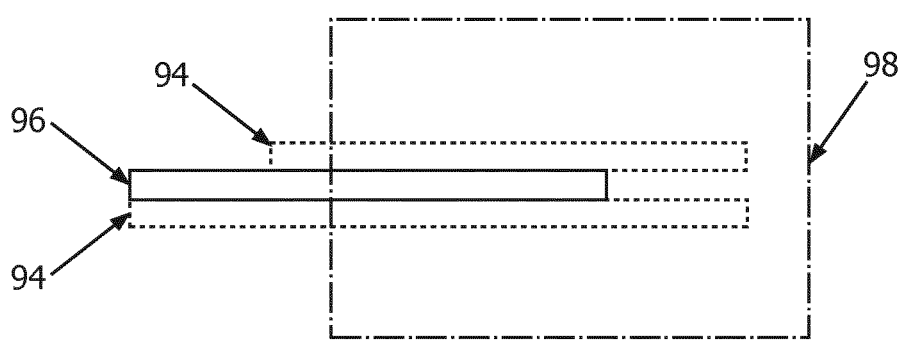
FIG. 13 is a cross-sectional view of a metal substrate, which may be the lead frame of FIGS. 7-10, showing an electrically insulating and thermally conductive layer over the substrate to electrically insulate an electrically conductive molded plastic body from the substrate.

In FIG. 12, we show a typical molding profile for thermoplastic injection molding. A horizontal axis TI shows the time, and a vertical axis TE shows the temperature. The process includes five phases, 12-1 represents a step of inserting an electrically conducting substrate with LEDs and an insulating layer into a mold, 12-2 represents a mold closing step usually lasting 0.1-10 seconds, 12-3 represents a plastic injection step with a high temperature of above 260-500° C. for 0.1-5 seconds, 12-4 represents a cooling step for 5-30 seconds, and 12-5 represents a mold open and part removal step. The plastic melts and is injected into the mold at temperatures significantly higher than the maximum temperature used in the reflow soldering, but the time at high temperature is much shorter. In one embodiment, the thermo-plastic is Nylon which is injected into the mold containing the LED insert at a temperature of 300° C. This temperature is significantly higher than the maximum of 260° C. used in reflow soldering of LEDs. The use of very fast injection speeds and fast cooling times prevents damage to the LED package in a new way completely orthogonal to conventional thinking. The material injection temperature is determined by the material melting temperature and can be from 280° C. for typical polycarbonate plastic to 480° C. for a moldable metal material. The key point is that, though the temperature is higher, the time is kept much shorter with the total time above 240° C. typically less than 5-10 seconds. In FIG. 13, we show how the addition of an electrically insulating layer 94 can be used to isolate an electrically conductive substrate 96 (such as the LED lead frame) from an electrically conductive thermo-plastic or injection moldable metal 98. The use of the insulating layer over an electrically conductive substrate expands the availability of injection moldable materials that can be used in creating the LED bulb dramatically and allows for the use of injection moldable materials with a much higher thermal conductivity. Typical thermo-plastic materials like polycarbonate or PMMA have a thermal conductivity <1 W/mK. These materials can be loaded with electrically insulating materials such as Silica and Alumina or electrically conducting materials such as metal and carbon to increase the thermal conductivity. The use of electrically conductive materials in loading plastics is preferred because the materials offer higher thermal conductivity at substantially lower cost. Beyond thermal plastic, it is possible using the technique described to mold injection moldable metals which have an injection temperature of 450-500° C. and a thermal conductivity above 100 W/mK.

The LED bulb described herein has very few parts, is extremely reliable, and has excellent thermal characteristics. The light emission pattern of the headlight reflector is a combination of the arrangement of the LED dies, the light blocking features of the plastic bulb body, and the shape of the reflector. The LED bulb 10 can replace conventional filament type H4 bulbs in existing headlight reflectors.

It is desirable for the LED bulb 10 to fit in the socket 25 so the bulb 10 forms a good seal without any secondary connector or sealing ring.

In another embodiment, the bulb 10 includes a rotatable sleeve 89 around the bulb 10 that is used to seal the bulb 10 with respect to the reflector. Tabs 90 fit into corresponding slots in the lamp or socket. Other lamp designs are envisioned using the present technique. Such designs may use a single set of LEDs and a body/reflector configured to generate only a single emission pattern.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

The invention claimed is:

1. A light emitting diode (LED) bulb for emitting at least two levels of light having different emission patterns and comprising a light emitting structure, the light emitting structure comprising:

a plurality of first light emitting diode (LED) dies, each of the first LED dies having a first electrode and a second electrode, wherein the first electrode of each of the first LED dies is electrically and thermally coupled to a lead frame;

a plurality of second LED dies, each of the second LED dies having a third electrode and a fourth electrode, wherein the third electrode of each of the second LED dies is electrically and thermally coupled to the lead frame;

a plurality of third LED dies, each of the third LED dies having a fifth electrode and a sixth electrode, wherein the fifth electrode of each of the third LED dies is electrically and thermally coupled to the lead frame, wherein, on the lead frame, the second LED dies and the third LED dies are both spaced away from the first LED dies, and wherein the lead frame is configured so that light emitting top surfaces of the first LED dies face a first direction, light emitting top surfaces of the second LED dies face a second direction, and light emitting top surfaces of the third LED dies face a third direction, the first direction being different from the second and third directions, and the second and third directions being opposite to each other; and wherein portions of the lead frame terminate in connectors extending from a thermally conductive thermoplastic body, wherein the thermally conductive thermoplastic body comprises:

first light blocking features for the first LED dies to cause the first LED dies to have a first emission pattern; and second light blocking features for the second and third LED dies to cause the second and third LED dies to have a second emission pattern different from the first emission pattern, wherein the first light blocking features comprise:

at least one lateral light blocking wall for the first LED dies;

at least one light blocking surface for the first LED dies; and the second light blocking features comprise:

at least one light blocking surface for each of the second and third LED dies; and the thermally conductive thermoplastic body comprises:

a front portion that blocks forward light from the first LED dies and the second and third LED dies.

2. The light emitting diode (LED) bulb claim 1, wherein a low electrical conductivity layer is formed over portions of the lead frame to form an electrically insulating layer, wherein the low electrical conductivity layer has an electrical resistivity of $>10^4$ Ohm-m.

3. The light emitting diode (LED) bulb of claim 2, wherein the thermally conductive thermoplastic body has an electrical resistivity $<10^4$ Ohm-m and a thermal conductivity $>1$ W/mK, and wherein the thermoplastic body is molded over at least a portion of the low electrical conductivity layer to electrically insulate the thermoplastic body from the lead frame.

4. The light emitting diode (LED) bulb of claim 1, further comprising optical lenses disposed over each of the first LED dies, the second LED dies, and the third LED dies and portions of said lead frame.

5. The light emitting diode (LED) bulb of claim 1, wherein the lead frame is a metal lead frame.

6. The light emitting diode (LED) bulb of claim 1, wherein the thermally conductive thermoplastic body is a thermoplastic with a melting temperature greater than 240° C.

7. The light emitting diode (LED) bulb of claim 1, wherein the thermally conductive thermoplastic body is a moldable metal compound with a melting temperature greater than 380° C.

8. The light emitting diode (LED) bulb of claim 1, wherein the thermally conductive thermoplastic body further comprises a reflective rear wall for redirecting rearward directed light from the first LED dies and the second and third LED dies.

9. The light emitting diode (LED) bulb of claim 8, wherein the reflective rear wall has a conical portion that reflects light outwardly and forward.

10. The light emitting diode (LED) bulb of claim 1 being configured for being installed in a reflector in a vehicle such that the light emitting top surfaces of the first LED dies are facing upwards within the reflector, and such that the light emitting top surfaces of the second and third LED dies are facing sideways, perpendicular to a forward direction of the vehicle.

11. The light emitting diode (LED) bulb of claim 1 wherein the lead frame is bent to cause the light emitting top surfaces of the first LED dies to face a direction different from the light emitting top surfaces of the second LED dies and third LED dies.

* * * * *